(12) United States Patent
Farnworth et al.

(10) Patent No.: US 6,620,731 B1
(45) Date of Patent: Sep. 16, 2003

(54) METHOD FOR FABRICATING SEMICONDUCTOR COMPONENTS AND INTERCONNECTS WITH CONTACTS ON OPPOSING SIDES

(75) Inventors: Warren M. Farnworth, Nampa, ID (US); Alan G. Wood, Boise, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/035,355

(22) Filed: Jan. 4, 2002

Related U.S. Application Data

(60) Continuation-in-part of application No. 09/961,646, filed on Sep. 25, 2001, which is a division of application No. 09/385,606, filed on Aug. 30, 1999, now Pat. No. 6,294,387, which is a division of application No. 08/993,965, filed on Dec. 18, 1997, now Pat. No. 6,107,109.

(51) Int. Cl.[7] .............................................. H01L 21/44
(52) U.S. Cl. ..................... 438/667; 438/666; 438/672
(58) Field of Search ................... 438/667, 666, 438/672, 629, 637, 675, 668

(56) References Cited

U.S. PATENT DOCUMENTS

| | | |
|---|---|---|
| 5,046,239 A | 9/1991 | Miller et al. |
| 5,063,177 A | 11/1991 | Geller et al. |
| 5,172,050 A | 12/1992 | Swapp |
| 5,229,647 A | 7/1993 | Gnadinger |
| 5,236,551 A | 8/1993 | Pan |
| 5,249,450 A | 10/1993 | Wood et al. |
| 5,404,044 A | 4/1995 | Booth et al. |
| 5,420,520 A | 5/1995 | Anschel et al. |
| 5,426,072 A | 6/1995 | Finnila |
| 5,483,741 A | 1/1996 | Akram et al. |
| 5,484,647 A * | 1/1996 | Nakatani et al. ............ 428/209 |
| 5,487,999 A | 1/1996 | Farnworth |
| 5,528,080 A | 6/1996 | Goldstein |
| 5,541,525 A | 7/1996 | Wood et al. |
| 5,557,844 A | 9/1996 | Bhatt et al. |
| 5,578,526 A | 11/1996 | Akram et al. |
| 5,592,736 A | 1/1997 | Akram et al. |
| 5,607,818 A | 3/1997 | Akram et al. |
| 5,633,122 A | 5/1997 | Tuttle |
| 5,634,267 A | 6/1997 | Farnworth et al. |
| 5,674,785 A | 10/1997 | Akram et al. |
| 5,686,317 A | 11/1997 | Akram et al. |
| 5,716,218 A | 2/1998 | Farnworth et al. |
| 5,781,022 A | 7/1998 | Wood et al. |
| 5,783,461 A | 7/1998 | Hembree |
| 5,783,865 A | 7/1998 | Higashiguichi et al. |
| 5,796,590 A | 8/1998 | Klein |
| 5,801,452 A | 9/1998 | Farnworth et al. |

(List continued on next page.)

OTHER PUBLICATIONS

"Forming Electrical Interconnections Through Semiconductor Wafers", T. R. Anthony, American Institute of Physics, 1981, pp. 5340–5349.

*Primary Examiner*—David L. Talbott
*Assistant Examiner*—Luan Thai
(74) *Attorney, Agent, or Firm*—Stephen A. Gratton

(57) ABSTRACT

A method for fabricating semiconductor components and interconnects includes the steps of providing a substrate, such as a semiconductor die, forming external contacts on opposing sides of the substrate by laser drilling vias through the substrate, and forming conductive members in the vias. The conductive members include enlarged terminal portions that are covered with a non-oxidizing metal. The method can be used to fabricate stackable semiconductor packages having integrated circuits in electrical communication with the external contacts. The method can also be used to fabricate interconnects for electrically engaging packages, dice and wafers for testing or for constructing electronic assemblies.

31 Claims, 6 Drawing Sheets

U.S. PATENT DOCUMENTS

| | | |
|---|---|---|
| 5,815,000 A | 9/1998 | Farnworth et al. |
| 5,834,945 A | 11/1998 | Akram |
| 5,869,974 A | 2/1999 | Akram et al. |
| 5,876,580 A | 3/1999 | Lykins |
| 5,878,485 A | 3/1999 | Wood et al. |
| 5,896,036 A | 4/1999 | Wood et al. |
| 5,915,977 A | 6/1999 | Hembree et al. |
| 5,929,647 A | 7/1999 | Akram et al. |
| 5,931,685 A | 8/1999 | Hembree et al. |
| 5,936,847 A | 8/1999 | Kazle |
| 5,952,840 A | 9/1999 | Farnworth et al. |
| 5,962,921 A | 10/1999 | Farnworth et al. |
| 6,013,948 A | 1/2000 | Akram et al. |
| 6,040,702 A | 3/2000 | Hembree et al. |
| 6,107,109 A | 8/2000 | Akram et al. |
| 6,107,119 A | 8/2000 | Farnworth et al. |
| 6,114,240 A | 9/2000 | Akram et al. |
| 6,162,997 A | 12/2000 | Memis |
| 6,294,837 B1 | 9/2001 | Akram et al. |
| 6,353,328 B2 | 3/2002 | Akram et al. |
| 6,356,098 B1 | 3/2002 | Akram et al. |
| 6,362,637 B2 | 3/2002 | Farnworth et al. |
| 6,400,172 B1 | 6/2002 | Akram et al. |
| 6,417,685 B1 | 7/2002 | Akram et al. |
| 6,437,591 B1 | 8/2002 | Farnworth et al. |
| 6,451,624 B1 | 9/2002 | Farnworth et al. |

\* cited by examiner

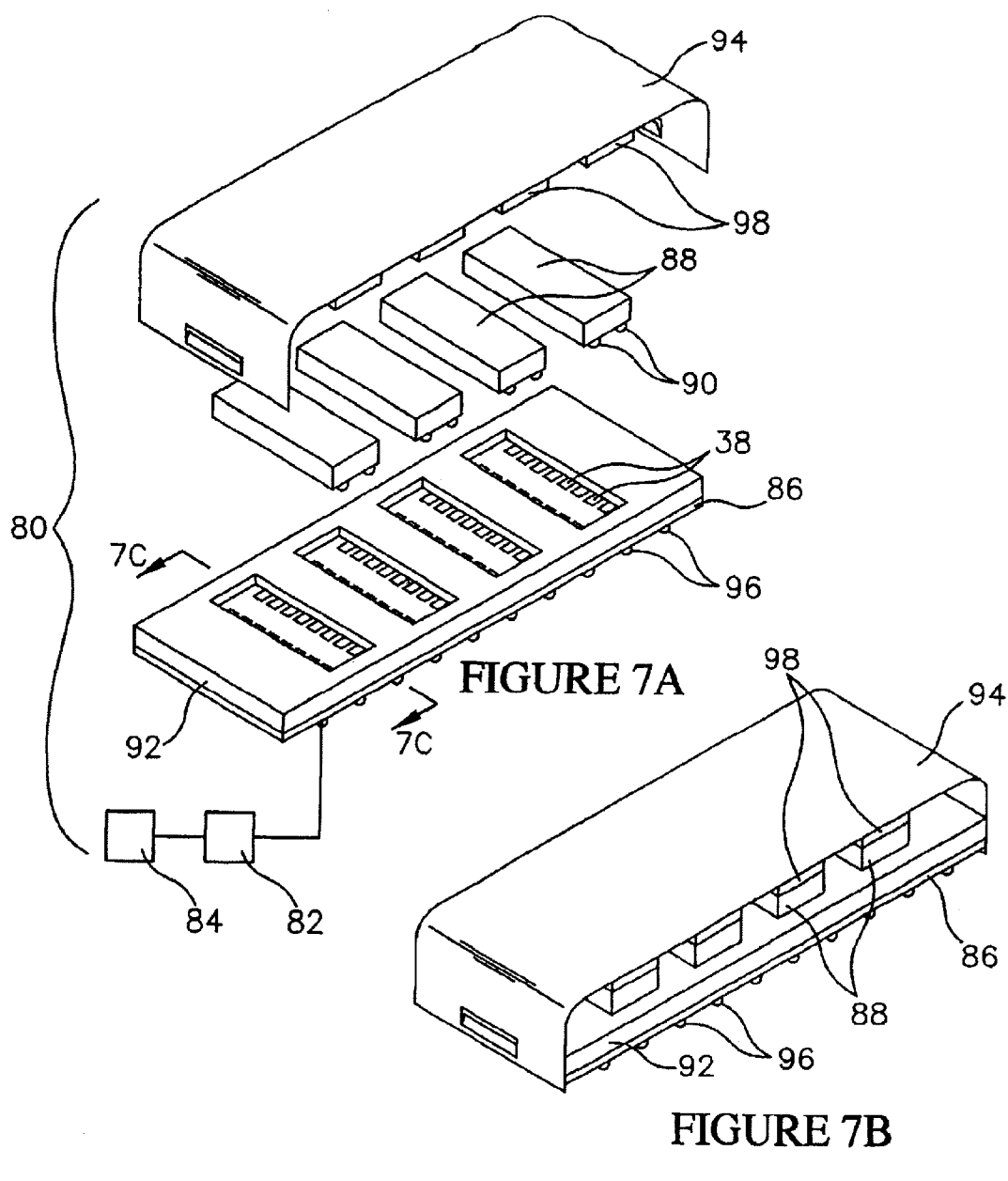
FIGURE 7A
FIGURE 7B
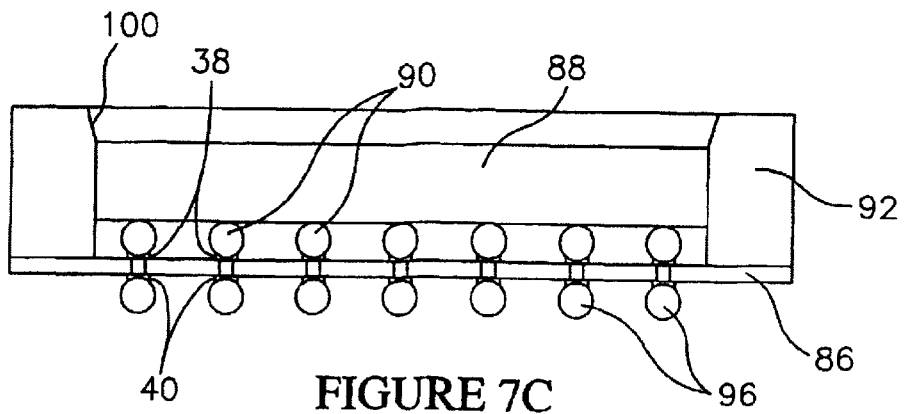
FIGURE 7C

METHOD FOR FABRICATING SEMICONDUCTOR COMPONENTS AND INTERCONNECTS WITH CONTACTS ON OPPOSING SIDES

CROSS REFERENCE TO RELATED APPLICATIONS

This application is a continuation-in-part of application Ser. No. 09/961,646 filed Sep. 25, 2001, which is a division of application Ser. No. 09/385,606, filed on Aug. 30, 1999, U.S. Pat. No. 6,294,387, which is a division of application Ser. No. 08/993,965, filed on Dec. 18, 1997, U.S. Pat. No. 6,107,109.

FIELD OF THE INVENTION

This invention relates generally to semiconductor manufacture, and specifically to a method for fabricating semiconductor components and interconnects with contacts on opposing sides.

BACKGROUND OF THE INVENTION

Semiconductor components include external contacts that allow electrical connections to be made from the outside to the integrated circuits contained on the components. A semiconductor die, for example, includes patterns of bond pads formed on the face of the die. Semiconductor packages, such as chip scale packages, also include external contacts. One type of semiconductor package includes solder balls arranged in a dense array, such as a ball grid array (BGA), or fine ball grid array (FBGA).

Typically, a component includes only one set of external contacts on either the face side (circuit side) or the back side of the component. However, it is sometimes necessary for a component to have external contacts on both sides. For example, for stacking a semiconductor package to another identical package, external contacts can be formed on the face of the package and on the back side as well. U.S. Pat. No. 6,271,056 to Farnworth et al. discloses this type of stackable package.

Interconnects configured to make electrical connections with semiconductor components also include external contacts. A wafer probe card is one type of interconnect adapted to make electrical connections between external contacts on a wafer under test, and test circuitry associated with a wafer handler. Another type of interconnect is adapted to electrically engage unpackaged dice, or chip scale packages, packaged within a test carrier. U.S. Pat. No. 5,541,525 to Wood et al. discloses this type of interconnect and test carrier.

In each of these examples, the interconnect includes external contacts for electrically engaging the external contacts on the semiconductor component. With a conventional needle probe card the external contacts comprise probe needles. With an interconnect used with a test carrier as described above, the interconnect contacts can comprise projections formed on a silicon substrate and covered with a conductive layer.

As with semiconductor components, the external contacts for an interconnect are often formed on both sides of the interconnect. For example, a probe card can include contacts on its face for electrically engaging the component, and contacts on its back side for electrically engaging spring loaded pins (e.g., "POGO PINS") in electrical communication with test circuitry. U.S. Pat. No. 6,060,891 to Hembree et al. discloses this type of interconnect.

The present invention is directed to a method for fabricating semiconductor components and interconnects with contacts on opposing sides.

SUMMARY OF THE INVENTION

In accordance with the present invention, a method for fabricating semiconductor components and interconnects is provided. Also provided are improved components and interconnects fabricated using the method, and improved electronic assemblies and test systems incorporating the components and the interconnects.

Initially a substrate having a face side, an opposing back side and a plurality of substrate contacts on the face side. For fabricating semiconductor components, such as packages, the substrate can comprise a semiconductor die containing integrated circuits. The substrate contacts can comprise bond pads in electrical communication with the integrated circuits. For fabricating interconnects the substrate can comprise a semiconductor, a ceramic or a plastic. In addition, the substrate contacts can be dummies or omitted entirely.

The method also includes the step of forming vias through the substrate using a laser beam directed through the substrate contacts. The method also includes the steps of forming conductive members in the vias, and then forming external contacts on the face side and the back side of the substrate in electrical communication with the conductive members. The external contacts can also include a non-oxidizing layer which facilitates making permanent or temporary electrical connections with the external contacts. The external contacts on the face side and the back side can have matching patterns that allows identical components to be stacked to one another. Alternately the external contacts on the face side and the back side can be offset or redistributed with respect to one another.

A semiconductor component, such as a die, a package or a wafer, fabricated using the method, includes the substrate and the external contacts on the face side and the back side. The external contacts on the face side can be bonded to external contacts on the back side of an identical component to make a stacked assembly. An interconnect fabricated using the method includes the external contacts on the face side which can be configured to electrically engage a semiconductor component. The interconnect also includes external contacts on the back side which can be configured to electrically engage electrical connectors associated with test circuitry.

In an alternate embodiment of the method, the vias are initially formed as counter bores, and the conductive members are formed in the vias. The substrate is then thinned from the back side using a thinning process, such as chemical mechanical planarization (CMP) or etching, to expose the conductive members.

An electronic assembly includes multiple stacked components fabricated using the method. Another electronic assembly includes an interconnect fabricated using the method having semiconductor components attached to opposing sides. A test system for testing singulated components, such as dice and packages, includes a die level interconnect mounted to a test carrier configured to temporarily package the components. A test system for testing wafers, or other substrates containing multiple components, includes a wafer level interconnect mounted to a test apparatus such as a wafer prober.

BRIEF DESCRIPTION OF THE DRAWINGS

FIGS. 7A and 7B are schematic perspective views illustrating a test system that includes a die level interconnect fabricated using the method;

FIG. 7C is an enlarged cross sectional view taken along section line 7C—7C of FIG. 7B;

DETAILED DESCRIPTION OF THE PREFERRED EMBODIMENTS

As used herein, the term "semiconductor component" means an electronic component that includes a semiconductor die. Exemplary semiconductor components include bare semiconductor dice, chip scale packages, ceramic or plastic semiconductor packages, BGA devices, semiconductor wafers, and panels and leadframes containing multiple dice or chip scale packages.

An "interconnect" means an electronic component configured to make electrical connections with a semiconductor component. A die level interconnect can be configured to electrically engage singulated components such as a die or a package. A wafer level interconnect can be configured to electrically engage a substrate, such as a wafer, a panel, or a leadframe, containing multiple components.

Figure 1A:
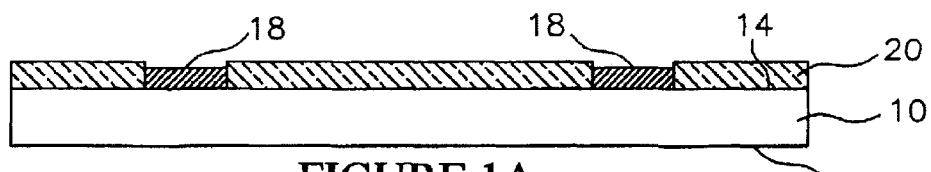
FIGS. 1A–1G are schematic cross sectional views illustrating a method for fabricating semiconductor components and interconnects on a substrate in accordance with the invention.

Referring to FIGS. 1A–1G, a method for fabricating semiconductor components and interconnects in accordance with the invention is illustrated. Initially as shown in FIG. 1A, a substrate 10 is provided. Preferably, the substrate 10 comprises a wafer of material on which multiple components or interconnects will be fabricated using semiconductor circuit fabrication techniques, and then singulated by cutting the wafer.

If the semiconductor component being fabricated is a package, such as a chip scale package, the substrate 10 can comprise a semiconductor die containing a plurality of integrated circuits. The die in turn can be contained on a wafer which includes a plurality of dice which are then singulated into individual packages. Depending on the application, the die can be configured as a memory device, as a vertical cavity surface emitting laser device (VCSEL), or in any other conventional configuration.

If the semiconductor component being fabricated is an interconnect, the substrate can comprise a semiconductor material such as monocrystalline silicon, germanium, silicon-on-glass, or silicon-on-sapphire. These materials have a TCE (thermal coefficient of expansion) that matches, or is close to, the TCE of the mating semiconductor component which the interconnect engages. Alternately, the substrate 10 can comprise a ceramic material, such as mullite, or a plastic material, such as a glass filled resin (e.g., FR-4).

The substrate 10 includes a face side 14 ("first side" in the claims) and an opposing back side 16 ("second side" in the claims). The face side 14 and the back side 16 are the major planar surfaces of the substrate 10, and are generally parallel to one another. A representative thickness of the substrate 10 can be from about 12 mils to 38 mils. A peripheral size and shape of the substrate 10 can be selected as required. For example, semiconductor dice have generally rectangular or square peripheral shapes.

As shown in FIG. 1A, the substrate 10 can include substrate contacts 18, and a front side insulating layer 20. The substrate contacts 18 are formed of a highly conductive metal such as aluminum, titanium, nickel, iridium, copper, gold, tungsten, silver, platinum, palladium, tantalum, molybdenum or alloys of these metals. If the substrate 10 is a semiconductor die, the substrate contacts 18 can be the device bond pads, or alternately redistribution layer pads, in electrical communication with the integrated circuits contained on the die.

Figure 2A:
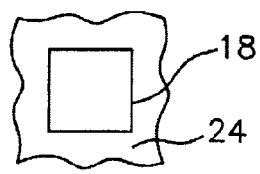
FIG. 2A is a top view taken along line 2A—2A of FIG. 1B illustrating a substrate contact on the substrate.

If an interconnect is being fabricated, the substrate contacts 18 can be dummy contacts, or can be omitted entirely. As shown in FIG. 2A, the substrate contacts 18 have a generally square peripheral shape. However, other shapes such as rectangular, circular or oval can also be employed. A size of the substrate contacts 18 can also be selected as required (e.g., 10–100 μm on a side).

The front side insulating layer 20 can comprise an electrically insulating material deposited to a desired thickness using a suitable deposition process (e.g., CVD, sputtering, spin-on). Exemplary materials include glass materials such as BPSG, oxide materials, such as $SiO_2$, or polymer materials, such as polyimide. If the substrate 10 is a die, the front side insulating layer 20 can be the outer passivation layer for the die. A thickness for the front side insulating layer 20 will be dependent on the material. For example oxide materials can be deposited to thicknesses of 500 Å or less, and polymer materials can be deposited to thicknesses of several mils or more.

Figure 1B:
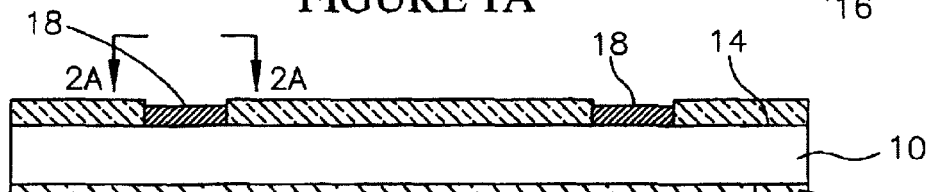

As shown in FIG. 1B, a back side insulating layer 22 is blanket deposited on the back side 16 of the substrate 10. The purpose of the back side insulating layer 22 is to provide electrical insulation for the back side 16. The back side insulating layer 22 can be formed of the same materials as previously described for the front side insulating layer 22 using a suitable deposition process (e.g., CVD, sputtering, spin-on).

Figure 1C:
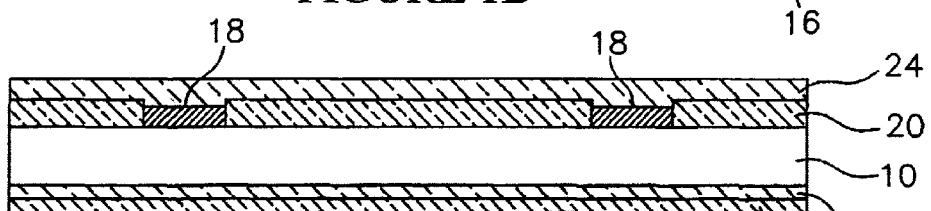

As shown in FIG. 1C, a front side protective mask 24 is formed on the front side insulating layer 20, and a back side protective mask 26 is formed on the back side insulating layer 22. Preferably the protective masks 24, 26 comprise a photoimageable material, such as a photoresist, or a photoimageable polymer, such as polyimide. The protective masks 24, 26 can be deposited using a suitable deposition process such as spin-on and then soft baked to drive out solvents. Depending on the material, a representative thickness for the protective masks 24, 26 can be from 10,000 Å to 50 μm. Following the softbake, the front side protective mask 24 is aligned with a mask and exposed using UV light.

Figure 1D:
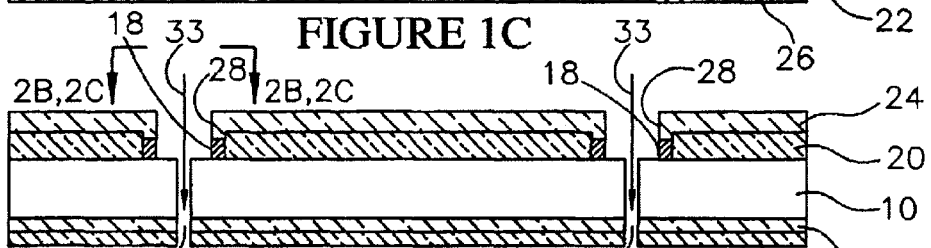

As shown in FIG. 1D, the front side protective mask 24 is developed to form openings 28 aligned with the substrate contacts 18. The substrate contacts 18 are then etched such that the openings 28 also extend through the substrate contacts 18 to the substrate 10. Depending on the material for the substrate contacts 18 a wet etchant can be used to etch the substrate contacts 18. For example, for substrate contacts 18 made of aluminum, one suitable wet etchant is $H_3PO_4$.

Figure 2B:
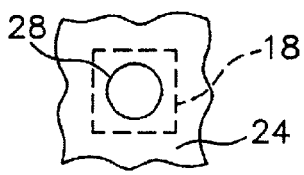
FIG. 2B is a top view taken along line 2B—2B of FIG. 1D illustrating the substrate contact following an etching step but prior to a laser drilling step.

FIG. 2B illustrates the mask 24 and the substrate contacts 18 following the etching step but prior to a laser drilling step. As shown in FIG. 2B, the openings 28 in the mask 24 and in the substrate contacts 18 are generally circular, and are smaller in diameter than the width of the substrate contacts 18. The substrate contacts 18 thus have metal around their peripheries but no metal in the center. In the illustrative embodiment the openings 28 have a diameter that is about half the width of the substrate contacts 18. In addition, the openings 28 surround a portion of the substrate 10, such that the substrate contacts 18 and the openings 28 form targets, or bullseyes, for a subsequent laser drilling step in which a laser beam 33 (FIG. 1D) is directed at the openings 28 and through the substrate 10. The laser beam 33 (FIG. 1D) initially pierces the substrate 10 on the portions of the substrate 10 surrounded by the openings 28.

Figure 2C:
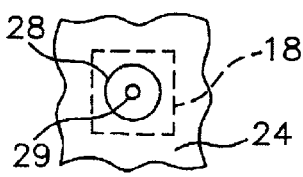
FIG. 2C is a top view taken along line 2C—2C of FIG. 1D illustrating the substrate contact following the laser drilling step.

As shown in FIG. 1D, the laser drilling step forms lasered openings 29 through the substrate 10, through the back side insulating layer 22 and through the back side protective mask 26. FIG. 2C illustrates the mask 24 and the substrate contacts 18 following the laser drilling step.

As shown in FIG. 2C, the lasered openings 29 do not touch the metal of the substrate contacts 18, as they are located in the middle of the openings 28 in the substrate contacts 18. In the illustrative embodiment, the lasered openings 29 have diameters that are about half the diameters of the openings 28. The laser beam 33 (FIG. 1D) thus initially contacts and pierces the substrate 10 without having to contact and pierce the metal that forms the substrate contacts 18. This eliminates shorting between the completed external contacts 38 (FIG. 1G) and the substrate 10 because any conducting or semiconducting material redeposited by penetration of the laser beam 33 will not contact the external contacts 38.

Following the laser drilling step, a cleaning step can be performed in which the lasered openings 29 are cleaned using a suitable wet or dry etchant. One suitable wet etchant for cleaning the lasered openings 29 with the substrate 10 comprising silicon is tetramethylammoniumhydroxide (TMAH).

Figure 1E:
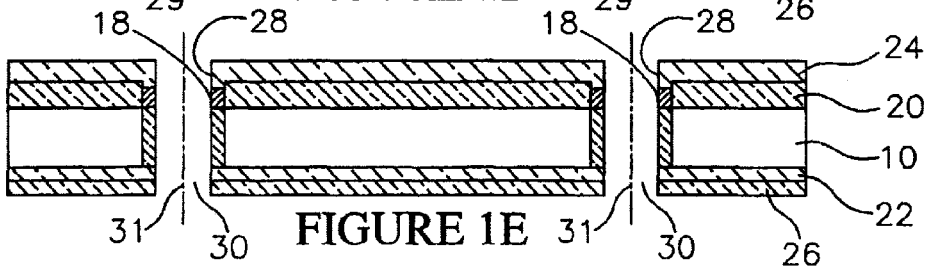

As shown in FIG. 1E, the cleaning step forms vias 30 which extend through the substrate 10, through the back side insulating layer 22, and through the back side protective mask 26. In the illustrative embodiment the vias have diameters that are about twice the inside diameters of the lasered openings 29, and about equal to the inside diameters of the openings 28. By way of example, the diameters of the vias 30 can be from 10 μm to 2 mils or greater.

A suitable laser system for performing the laser drilling step is manufactured by Electro Scientific, Inc., of Portland, Oreg. and is designated a Model No. 2700. A representative laser fluence for forming the vias 30 through a silicon substrate having a thickness of about 28 mils, is from 2 to 10 watts/per opening at a pulse duration of 20–25 ns, and at a repetition rate of up to several thousand per second. The wavelength of the laser beam can be a standard UV wavelength (e.g., 455 nm).

As shown in FIG. 1E, the vias 30 are preferably generally perpendicular to the face side 14, and to the back side 16 of the substrate 10. In addition, the vias 30 are located along a longitudinal axis 31 which preferably extends through the centers of the openings 28 in the front side protective mask 24 and the substrate contacts 18. The openings 28 and the substrate contacts 18 thus provide targets for aligning the laser beam. In addition, the openings 28 help to compensate for misalignment of the laser beam because the openings 28 will subsequently determine the peripheral shape of the external contacts 38 (FIG. 1G). Further, during the laser drilling step the protective masks 24, 26 protect the face side 14 and the back side 16 of the substrate 10.

As also shown in FIG. 1E, following formation of the vias 30, insulating layers 32 can be formed on the inside surfaces of the vias 30. The insulating layers 32 electrically insulate the vias 30 from the rest of the substrate 10, and are required if the substrate 10 comprises a semiconductor material. The insulating layers 32 can be a grown or deposited material.

With the substrate 10 comprising silicon, the insulating layers 32 can be an oxide, such as $SiO_2$, formed by a growth process by exposure of the substrate 10 to an $O_2$ atmosphere at an elevated temperature (e.g., 950° C.). In this case the insulating layers 32 do not completely close the vias 30, but form only on the sidewalls of the vias 30. Alternately, the insulating layers 32 can comprise a deposited electrically insulating material, such as an oxide or a nitride, deposited using a deposition process such as CVD.

The insulating layers 32 can also comprise a polymer material deposited using a suitable deposition process such as screen printing. In this case, if the insulating material completely fills the vias 30, a subsequent laser drilling step, substantially as previously described, may be required to re-open the vias 30. If the substrate 10 comprises an electrically insulating material, such as ceramic, or a glass filled resin, such as FR-4, the insulating layers 32 are not required.

Following formation of the insulating layers 32, conductive members 34 (FIG. 1G) can be formed within the vias 30. The conductive members 34 can be plugs that completely fill the vias 30, or alternately, can be layers that cover just the inside surfaces or sidewalls of the vias 30. The conductive members 34 can comprise a highly conductive metal, such as aluminum, titanium, nickel, iridium, copper, gold, tungsten, silver, platinum, palladium, tantalum, molybdenum or alloys of these metals. The above metals can be deposited within the openings 28 using a deposition process, such as electroless deposition, CVD, or electrolytic deposition. Alternately a solder metal can be screen printed in the vias 30 and drawn into the vias 30 with capillary action. A solder metal can also be drawn into the vias 30 using a vacuum system and a hot solder wave.

Rather than being a metal, the conductive members 34 can comprise a conductive polymer, such as a metal filled silicone, or an isotropic epoxy. Suitable conductive polymers are sold by A.I. Technology, Trenton, N.J.; Sheldahl, Northfield, Minn.; and 3M, St. Paul, Minn. A conductive polymer can be deposited within the vias 30, as a viscous material, and then cured as required. A suitable deposition process, such as screen printing, or stenciling, can be used to deposit the conductive polymer into the vias 30.

In the embodiment illustrated in FIGS. 1A–1G, the conductive members 34 are formed by an electroless deposition process. To perform the electroless deposition process, a seeding step is performed in which the substrate 10, with the protective masks 24, 26 thereon, is dipped in a seed solution. Seed solutions for electroless deposition of various metals are known to those skilled in the art. For example, for depositing copper conductive members 34 the seed solution can comprise a copper sulfate solution available from Shipley. The seed solution adheres to all exposed surfaces including on the protective masks 24, 26 and in the openings 28.

Figure 1F:
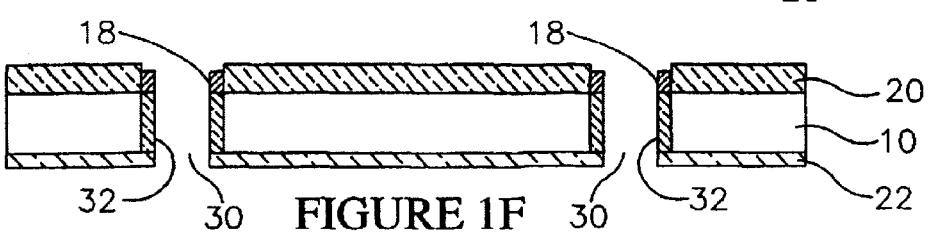
Figure 1G:
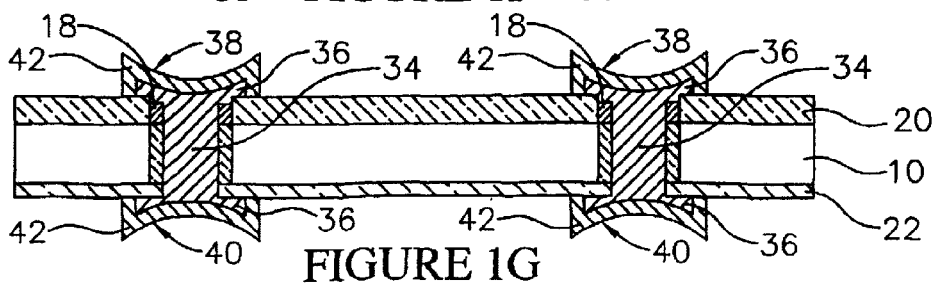

As shown in FIG. 1F, following the seeding step, a stripping step is performed in which the protective masks 24, 26 are stripped. Depending on the material for the masks 24, 26, the stripping step can be performed using a suitable stripper or solvent. For example, acetone and methylethylketone can be used for a positive resist, and a solution of $H_2SO_4$ and $H_2O_2$ can be used for a negative resist. However, the stripper must be selected to not attack the seed solution which adheres to the sidewalls of the vias 30.

Next, as shown in FIG. 1G, an electroless deposition step is performed in which a metal is electrolessly deposited into the vias 30 to form the conductive members 34. The electroless deposition step can be performed by dipping the substrate 10 in a suitable electroless deposition solution. For example, for depositing copper conductive members 34, the electroless deposition solution can comprise a nickel hypophosphate solution available from Shipley or Packaging Technology of Nauen, Germany.

As shown in FIG. 1G, the electroless deposition step forms the conductive members 34 with generally concave terminal portions 36 (dish shaped buttons) on the insulating layers 20, 22. As will be further explained, the concave terminal portions 36 facilitate making electrical connections with bumped contacts, such as solder balls or bumps. The conductive members 34 are also in electrical communication with the substrate contacts 18. In addition, the conductive members 34 at least partially fill the vias 30, and physically contact the substrate contacts 18.

As also shown in FIG. 1G, following formation of the conductive members 34, non-oxidizing metal layers 42 are formed on the concave terminal portions 36 of the conductive members 34. The non-oxidizing metal layers 42 can be formed using a suitable deposition process such as electroless deposition or CVD. With electroless deposition, a mask is not required, as the substrate 10 is dipped into a suitable solution and deposition onto the terminal portions 36 occurs as previously described. With CVD, a mask (not shown) can be formed on the insulating layers 20, 22, having openings aligned with the terminal portions 36 of the conductive members 34. The non-oxidizing metal can then be deposited through the openings to a desired thickness.

Suitable metals for the non-oxidizing metal layers 42 include gold, platinum, and palladium. A representative thickness for the non-oxidizing metal layers 42 can be from 600 Å to 3000 Å or more. In addition, the non-oxidizing metal layers 42 have a concave shape substantially similar to that of the concave terminal portions 36. Following the depositing of the non-oxidizing metal layers 42 the substrate 10 can be singulated into individual components or interconnects if required using a suitable process such as sawing, shearing, punching or etching.

As shown in FIG. 1G, the face side insulating layer 20 on the face side 14 of the substrate 10 includes face side external contacts 38 ("first external contacts" in the claims). The back side insulating layer 22 on the back side 16 of the substrate 10 includes back side external contacts 40 ("second external contacts" in the claims).

The size and spacing of the face side external contacts 38 matches the size and spacing of the back side external contacts 40, such that each face side external contact 38 has a mating back side external contact 40 located along a common longitudinal axis 31 (FIG. 1E). Stated differently, the face side external contacts 38 and the back side external contacts 40 have matching patterns such as a dense grid array. As will be further explained, alternately the back side external contacts 40 can be "offset" or "redistributed" with respect to the face side external contacts 38.

The conductive members 34 establish electrical communication between the mating external contacts 38, 40 on the opposing sides of the substrate 10. In addition, the conductive members 34 establish electrical communication between mating external contacts 38, 40 and the substrate contacts 18. If the substrate 10 includes integrated circuits in electrical communication with the substrate contacts 18, the external contacts 38, 40 are also in electrical communication with the integrated circuits.

Figure 3A:
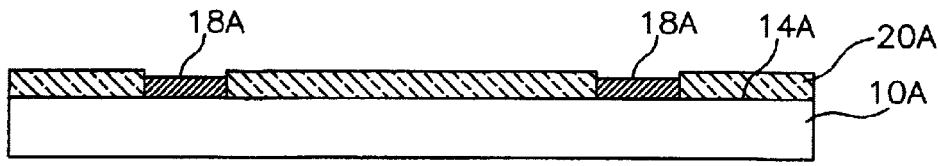
FIGS. 3A–3F are schematic cross sectional views illustrating an alternate embodiment method for fabricating semiconductor components and interconnects.

Referring to FIGS. 3A–3F, an alternate embodiment method for fabricating semiconductor components and interconnects is illustrated. Initially, as shown in FIG. 3A, a substrate 10A is provided having a front side 14A, a back side 16A, substrate contacts 18A and a front side insulating layer 20A as previously described.

Figure 3B:
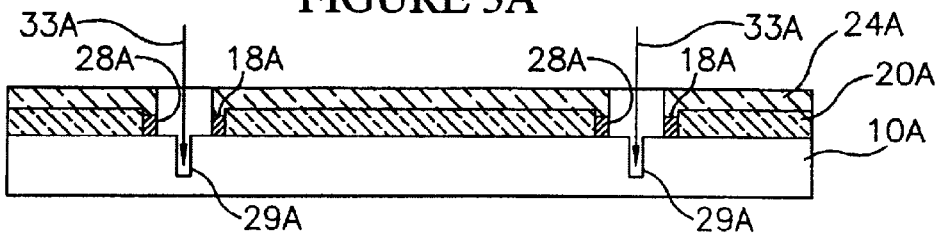

As shown in FIG. 3B, a front side protective mask 24A is formed on the front side 14A of the substrate 10A. The mask 24A is then used to etch openings 28A in the substrate contacts 18A as previously described. In addition, lasered openings 29A are formed in the substrate 10A by directing a laser beam 33A through the substrate 10A as previously described. However, in this case the laser drilling step is performed such that the laser openings 29A are counter bores that do not extend completely through the substrate 10A. For forming the laser openings 29A, parameters of the laser system, such as beam power, power distribution, pulse length and pulse duration of the laser beam 33, can be adjusted such that the substrate is not pierced.

Figure 3C:
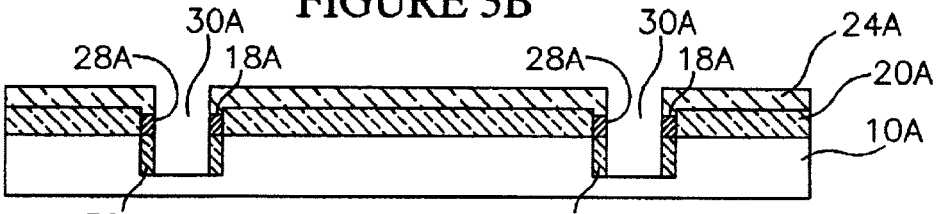

Next, as shown in FIG. 3C, a cleaning step is performed in which the lasered openings 29A are cleaned and enlarged as previously described to form vias 30A. Again the vias 30A are counter bores that do not extend completely through the substrate 10A. As also shown in FIG. 3C, insulating layers 32A are formed in the vias 30A as previously described.

Figure 3D:
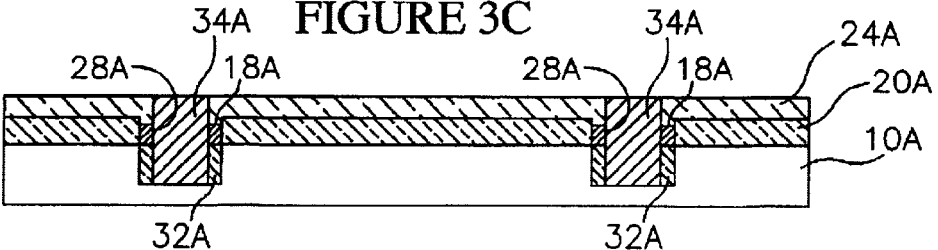

Next, as shown in FIG. 3D, conductive members 34A are formed in the vias 30A. The conductive members 34A can comprise a metal or a conductive polymer deposited as previously described using a deposition process such as CVD or screen printing. However, in this case the mask 24A is retained, and the conductive members 34A are also formed in the openings 28A and have surfaces generally planar to a surface of the mask 24A.

Figure 3E:
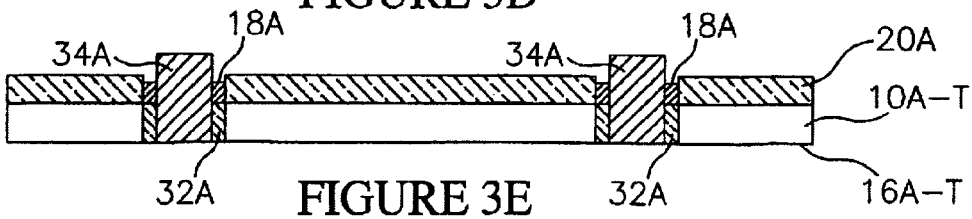

Next, as shown in FIG. 3E, the mask 24A is stripped as previously described. In addition, a thinning step is performed in which the substrate 10A is thinned from the back side 16A to form a thinned substrate 10A-T. In addition, the thinning step is controlled to planarize and expose the conductive members 34A on a thinned back side 16A-T of the thinned substrate 10A-T. One process for performing the thinning step is chemical mechanical planarization (CMP). One suitable CMP apparatus for performing the thinning step is a Model 372 manufactured by Westech. The thinning step can also be performed by etching the back side 16A of the substrate 10A using a suitable etchant.

Figure 3F:
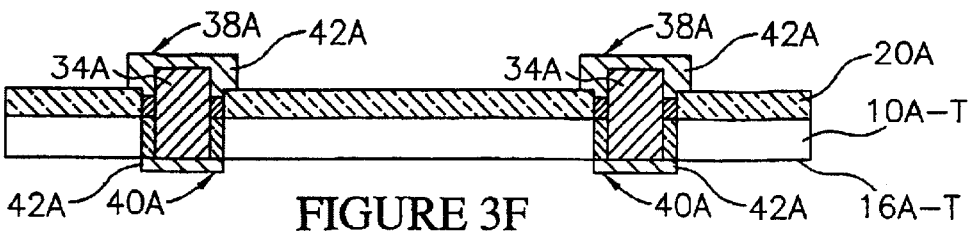

Next, as shown in FIG. 3F, non-oxidizing layers 42A are formed on the conductive members 34A, as previously described. However, unless the substrate 10 comprises an electrically insulating material such as ceramic or plastic, the non-oxidizing layers 42A on the thinned back side 16A-T must only contact the conductive members 34A and insulating layers 32A. The completed front side external contacts 38A and back side external contacts 40A function substantially as previously described.

Figure 4A:
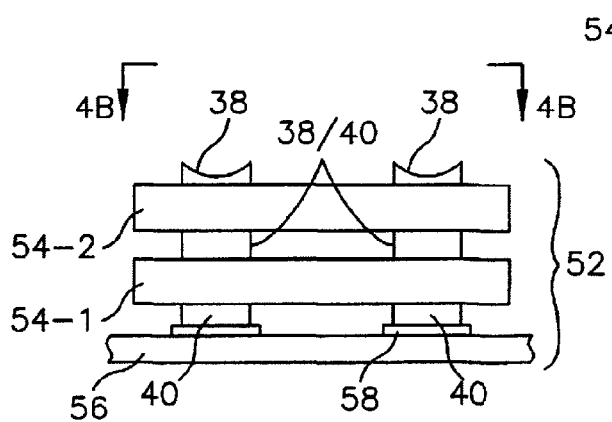
FIG. 4A is a schematic side elevation view illustrating an electronic assembly fabricated using stackable components fabricated using the method.
Figure 4B:
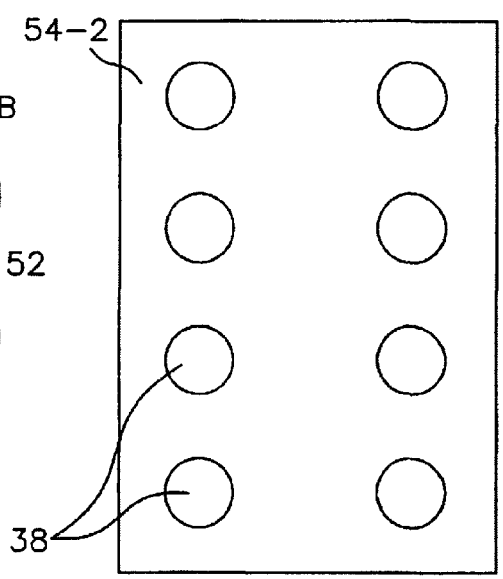
FIG. 4B is a plan view taken along line 4B—4B of FIG. 4A.

Referring to FIGS. 4A and 4B, an electronic assembly 52 constructed using stackable components 54-1, 54-2 fabricated in accordance with the method of the invention are illustrated. In this embodiment, the stackable components 54-1, 54-2 are in the form of singulated packages having a chip scale configuration. However, it is to be understood that the stackable components 54-1, 54-2 can also comprise stackable semiconductor dice, stackable semiconductor wafers or stackable panels. In addition, although only two components 54-1, 54-2 form the assembly 52, it is to be understood that any number of stackable components can be utilized.

In addition to the stackable components 54-1, 54-2, the electronic assembly 52 includes a supporting substrate 56, such as a printed circuit board or multi chip module substrate, having a plurality of metal electrodes 58. The stackable components 54-1, 54-2 are stacked to one another with the back side external contacts 40 on the lowermost component 54-1 bonded to the electrodes 58 on the supporting substrate 56. In addition, the front side external contacts 38 on the lowermost component 54-1 are bonded to the back side external contacts 40 on the uppermost component 54-2. The external contacts 38, 40 can be bonded to one another by heating and reflowing the metal of the external contacts 38, 40. Alternately, solder and a solder reflow process can be used to bond the external contacts 38, 40 to one another. In either case the non-oxidizing layers 42 (FIG. 1G) on the external contacts 38, 40 facilitate the bonding process, and prevent the formation or resistance increasing oxide layers.

Figure 5A:
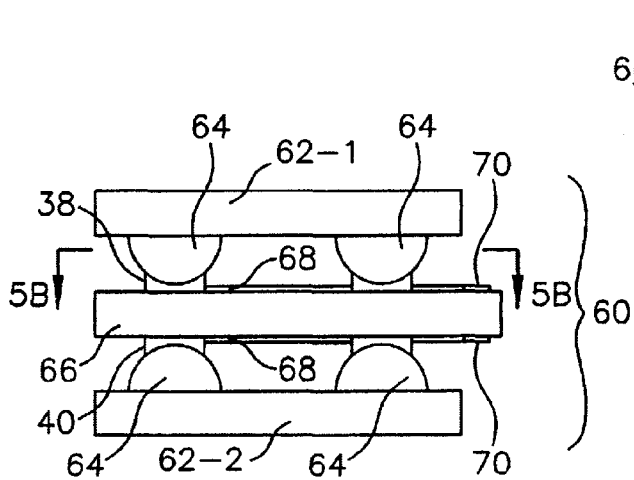
FIG. 5A is a schematic cross sectional view illustrating an electronic assembly that includes an interconnect fabricated using the method.
Figure 5B:
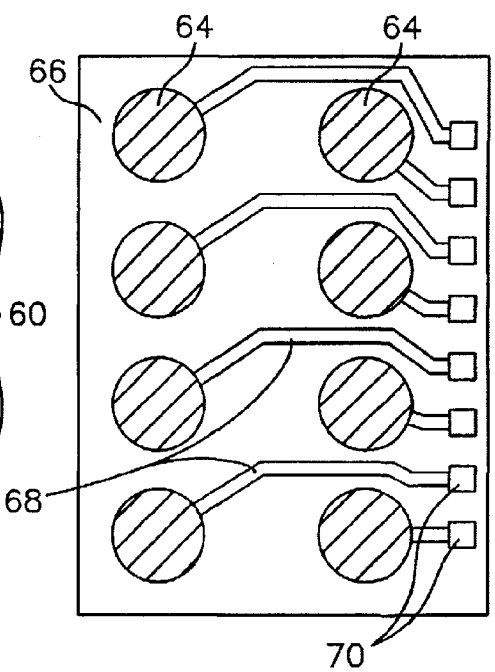
FIG. 5B is a cross sectional view taken along section line 5B—5B of FIG. 5A.

Referring to FIGS. 5A and 5B, an electronic assembly 60 constructed using an interconnect 66 fabricated in accordance with the invention is illustrated. In this embodiment, the electronic assembly 60 is in the form of a multi chip module. The interconnect 66 includes front side external contacts 38 and back side external contacts 40 as previously described. In addition, the interconnect 66 includes conductors 68 in electrical communication with the contacts 38, 40 and edge contacts 70 in electrical communication with the conductors 68.

The electronic assembly 60 also includes a semiconductor package 62-1 having bumped contacts 64, such as solder bumps or balls, bonded to the front side external contacts 38 on the interconnect 66. In addition, the electronic assembly 60 includes a semiconductor package 62-2 having bumped contacts 64 bonded to the back side external contacts 40 on the interconnect 66. Again, a reflow process or a soldering process can be used to bond the bumped contacts 64 to the external contacts 38, 40.

Figure 6:
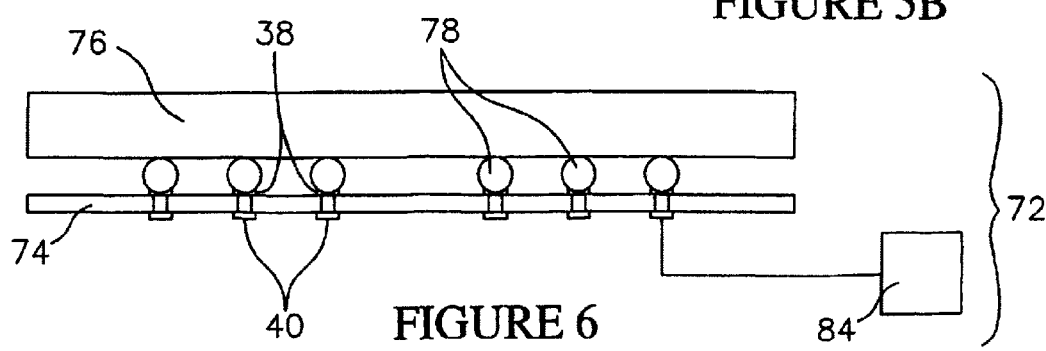
FIG. 6 is a schematic cross sectional view illustrating a test system that includes an interconnect fabricated using the method.

Referring to FIG. 6, a test assembly 72 constructed using an interconnect 74 fabricated in accordance with the invention is illustrated. The test assembly 72 includes test circuitry 84 configured to generate and apply test signals to a device under test 76. By way of example, the device under test 76 can comprise a die, a package, a wafer or a panel having bumped contacts 78. The test circuitry 84 is in electrical communication with the back side external contacts 40 on the interconnect 74. The front side external contacts 38 establish temporary electrical connections with the device contacts 78.

Referring to FIGS. 7A–7C, a die level test system 80 constructed with an interconnect 86 fabricated in accordance with the invention is illustrated. The test system 80 is configured to temporarily package and test multiple semiconductor components 88 such as dice, packages, or BGA devices having bumped contacts 90.

The test system 80 includes the interconnect 86 which is configured to electrically engage the bumped contacts 90 on the components 88. The test system 80 also includes an alignment member 92 configured to align the components 88 on the interconnect 86, and a force applying mechanism 94 with elastomeric members 98 configured to bias the components 88 and the interconnect 86 together.

The interconnect 86 includes the front side external contacts 38 formed as previously described, and configured to make temporary electrical connections with the bumped contacts 90 on the components 88. In addition, the interconnect 86 includes the back side external contacts 40 formed as previously described but with terminal contacts 96, such as solder balls attached thereto. The terminal contacts 96 are configured for mating electrical engagement with a test apparatus 82, such as a test socket or burn-in board in electrical communication with test circuitry 84. The test circuitry 84 is configured to apply test signals to the integrated circuits contained on the components 88 and to analyze the resultant signals.

As shown in FIG. 7B, the force applying mechanism 94 attaches to the alignment member 92 and the interconnect 86, and biases the components 88 and the interconnect 86 together. As shown in FIG. 7C, the alignment member 92 includes tapered alignment openings 100 configured to align the components 88 on the interconnect 86.

Figure 8:
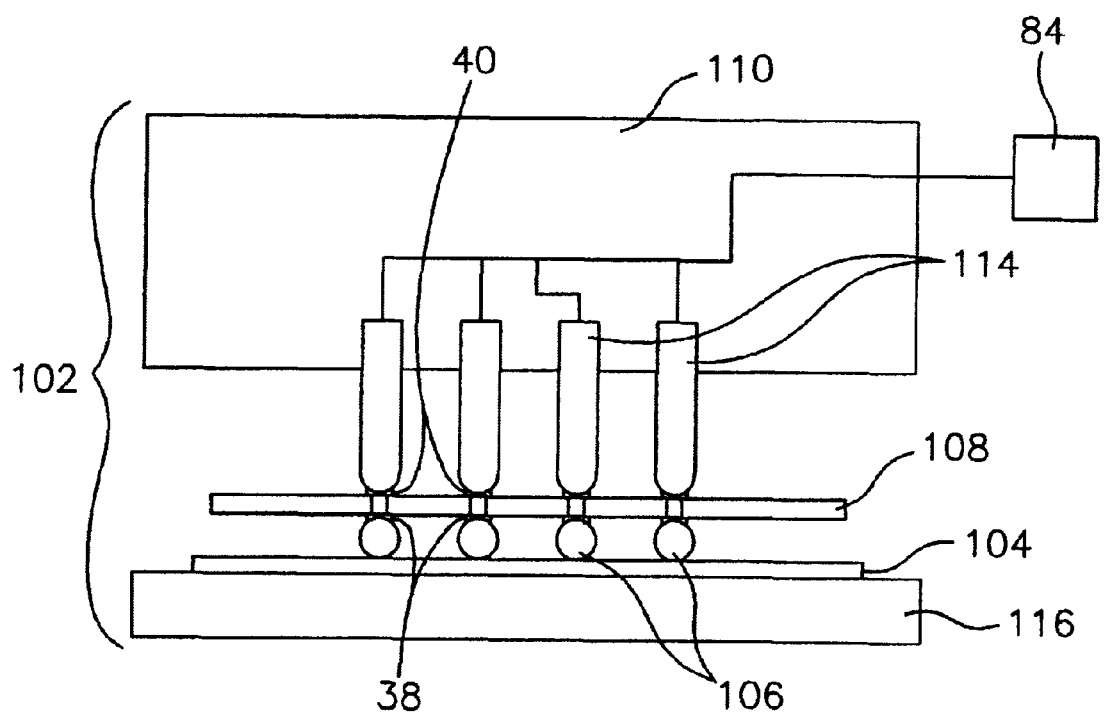
FIG. 8 is a schematic view illustrating a test system that includes a wafer level interconnect fabricated using the method.

Referring to FIG. 8, a wafer level test system 102 suitable for testing a wafer sized semiconductor component 104 with bumped contacts 106 is illustrated. By way of example, the semiconductor component 104 can comprise a semiconductor wafer containing bare dice, a wafer or panel containing chip scale packages, a printed circuit board containing semiconductor dice, or an electronic assembly, such as a field emission display containing semiconductor dice.

The wafer level test system 102 includes an interconnect 108 constructed as previously described, and mounted to a testing apparatus 110. The testing apparatus 110 includes, or is in electrical communication with test circuitry 84. The testing apparatus 110 also includes a wafer chuck 116 configured to support and move the component 104 in x, y and z directions as required. The testing apparatus 110 can comprise a conventional wafer probe handler, or probe tester, modified for use with the interconnect 108. Wafer probe handlers and associated test equipment are commercially available from Electroglass, Advantest, Teradyne, Megatest, Hewlett-Packard and others. In this system 102, the interconnect 108 takes the place of a conventional probe card.

The interconnect 108 includes the previously described front side external contacts 38 configured to establish temporary electrical connections with the bumped contacts 106 on the component 108. In addition, the interconnect 108 includes the previously described back side external contacts 40 configured to electrically engage spring loaded electrical connectors 114 (e.g., "POGO PINS" manufactured by Pogo Instruments, Inc., Kansas City, Kans.) in electrical communication with the testing circuitry 112.

Figure 9:
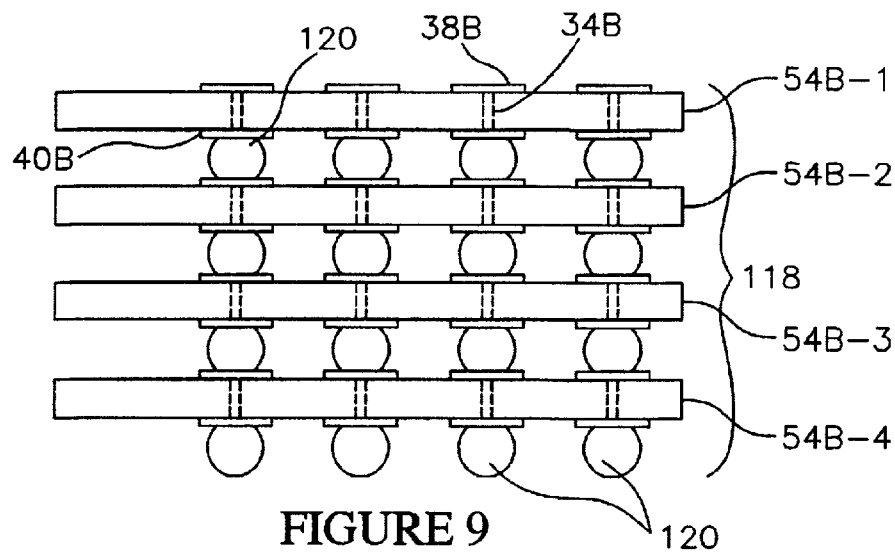
FIG. 9 is a schematic side elevation view illustrating an electronic assembly fabricated using stackable components fabricated using the method.

Referring to FIG. 9, an electronic assembly 118 constructed using stackable components 54B-1, 54B-2, 54B-3, 54B-4 fabricated in accordance with the method of the invention are illustrated. In this embodiment, the stackable components 54B-1, 54B-2, 54B-3, 54B-4 are in the form of singulated packages having a chip scale configuration substantially similar to the previously described stackable component 54. However, as before stackable semiconductor dice, stackable semiconductor wafers or stackable panels can be employed. In addition, although four components 54B-1, 54B-2, 54B-3, 120-4 form the assembly 118, it is to be understood that any number of stackable components can be utilized.

Each stackable component 54B-1, 54B-2, 54B-3, 54B-4 includes face side external contacts 38B and back side external contacts 40B having matching patterns. Each stackable component 54B-1, 54B-2, 54B-3, 54B-4 also includes conductive members 34B formed using a laser machining process as previously described. In addition, the back side external contacts 40B include bumped contacts 120 such as solder balls or bumps attached thereto using a suitable process such as ball bumping, bump deposition or reflow bonding. The bumped contacts 120 and face side external contacts 40B on adjacent components 54B-1, 54B-2, 54B-3, 54B-4 are bonded to one another using a suitable bonding process such as reflow bonding.

Figure 10A:
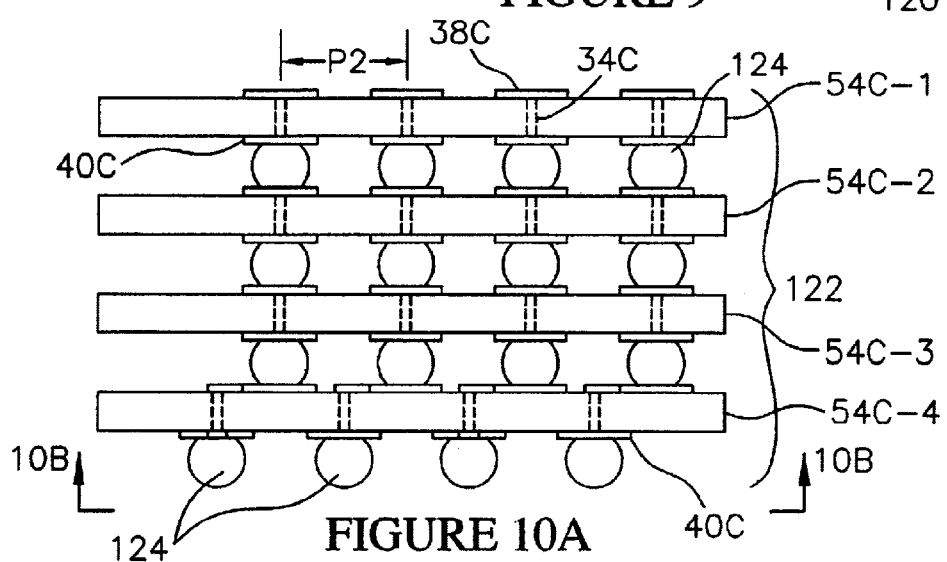
FIG. 10A is a schematic side elevation view illustrating an electronic assembly fabricated using stackable components fabricated using the method.
Figure 10B:
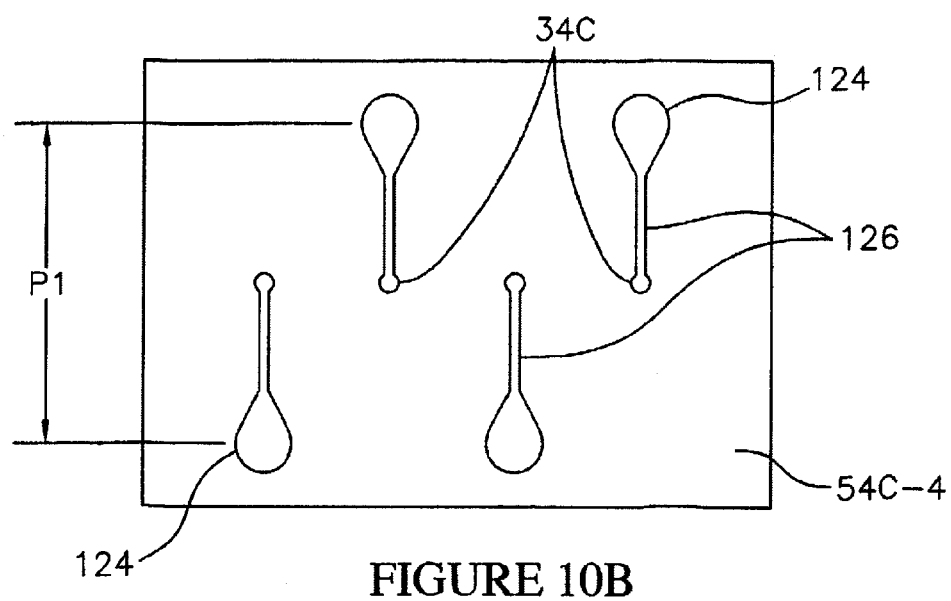
FIG. 10B is a plan view taken along line 10B–10B of FIG. 10A.

Referring to FIGS. 10A and 10B, an electronic assembly 122 constructed using stackable components 54C-1, 54C-2, 54C-3, 54C-4 fabricated in accordance with the method of the invention are illustrated. In this embodiment, the stackable components 54C-1, 54C-2, 54C-3, 54C-4 are in the form of singulated packages having a chip scale configuration substantially similar to the previously described stackable component 54. However, as before stackable semiconductor dice, stackable semiconductor wafers or stackable panels can be employed.

Each stackable component 54C-1, 54C-2, 54C-3 includes face side external contacts 38C and back side external contacts 40C having matching patterns. Each stackable component 54C-1, 54C-2, 54C-3 also includes conductive members 34C formed using a laser machining process as previously described. In addition, the back side external contacts 40C include bumped contacts 124 such as solder balls or bumps attached thereto using a suitable process such as ball bumping, bump deposition or reflow bonding. The bumped contacts 122 and face side external contacts 40C on adjacent components 54C-1, 54C-2, 54C-3 are bonded to one another using a suitable bonding process such as reflow bonding.

Although stackable components 54C-1, 54C-2, 54C-3 have identical configurations, the stackable component 54C-4 has a different configuration. Specifically, the back side external contacts 40C for stackable component 54C-4 are "offset" or "redistributed" with respect to the face side external contacts 38C. As shown in FIG. 10B, redistribution conductors 126 on the back side of the stackable component 54C-4 are in electrical communication with the conductive members 34C and with the back side external contacts 40C. This arrangement allows the back side external contacts 40C to have a different pattern than the face side external contacts 38C. For example, a pitch P1 of the back side external contacts 38C can be greater than a pitch P2 of the face side external contacts 38C. This arrangement can be used to facilitate bonding of the stackable component 54C-4 and thus the assembly 122 to a supporting substrate, such as a printed circuit board.

Thus the invention provides a method for fabricating semiconductor components and interconnect for semiconductor components. The invention also provides improved electronic assemblies and test systems constructed using components and interconnects fabricated in accordance with the invention.

Although the invention has been described with reference to certain preferred embodiments, as will be apparent to those skilled in the art, certain changes and modifications can be made without departing from the scope of the invention as defined by the following claims.

We claim:

1. A method for fabricating a semiconductor component or an interconnect for semiconductor components comprising:

providing a substrate comprising a contact, a first side and an opposing second side;

forming an opening in the contact;

forming a first electrically insulating layer on the first side and a second electrically insulating layer on the second side;

directing a laser beam through the opening and at the substrate without touching the contact to form a lasered opening through the substrate;

forming a conductive member in the lasered opening;

forming a first external contact on the first electrically insulating layer in electrical communication with the conductive member; and forming a second external contact on the second electrically insulating layer in electrical communication with the conductive member.

2. The method of claim 1 wherein the contact comprises metal and the substrate comprises a semiconductor.

3. The method of claim 1 further comprising forming non-oxidizing layers on the first external contact and on the second external contact.

4. A method for fabricating a semiconductor component or an interconnect for semiconductor components comprising:

providing a substrate comprising a first side and an opposing second side;

forming a first electrically insulating layer on the first side and a second electrically insulating layer on the second side;

directing a laser beam at the substrate to form a lasered opening through the substrate;

forming a conductive member in the lasered opening having a first enlarged terminal portion and a second enlarged terminal portion;

forming a first external contact on the first enlarged terminal portion; and forming a second external contact on the second enlarged terminal portion.

5. A method for fabricating a semiconductor component or an interconnect for semiconductor components comprising:

providing a substrate comprising a first side, an opposing second side and a contact on the first side comprising a metal;

forming an opening in the contact;

directing a laser beam at the opening and through the substrate without touching the metal to laser drill a via aligned with the opening;

forming a conductive member in the via in electrical communication with the contact;

forming a first external contact on the first side in electrical communication with the conductive member; and forming a second external contact on the second side in electrical communication with the conductive member.

6. The method of claim 5 wherein the opening surrounds a portion of the substrate and the laser beam pierces the substrate on the portion.

7. The method of claim 5 wherein the contact is in electrical communication with integrated circuits on the substrate.

8. The method of claim 5 further comprising forming non-oxidizing layers on the first external contact and on the second external contact.

9. The method of claim 5 wherein the substrate comprises a semiconductor material and further comprising forming an insulating layer in the via prior to forming the conductive member.

10. A method for fabricating a semiconductor component or an interconnect for semiconductor components comprising:

providing a substrate comprising a first side, an opposing second side and a contact on the first side;

forming an opening in the contact;

directing a laser beam at the opening and through the substrate to laser drill a via aligned with the opening;

forming a conductive member in the via in electrical communication with the contact;

forming a first external contact on the first side in electrical communication with the conductive member, the first external contact comprising a first enlarged terminal portion of the conductive member; and forming a second external contact on the second side in electrical communication with the conductive member, the second external comprising a second enlarged terminal portion of the conductive member.

11. A method for fabricating a semiconductor component or an interconnect for semiconductor components comprising:

providing a substrate comprising a first side, an opposing second side and a contact on the first side;

forming an opening in the contact;

directing a laser beam at the opening and through the substrate to laser drill a via aligned with the opening;

forming a conductive member in the via in electrical communication with the contact;

forming a first external contact on the first side comprising a first concave segment of the conductive member; and forming a second external contact on the second side comprising a second concave segment of the conductive member.

12. The method of claim 11 wherein the contact is in electrical communication with integrated circuits on the substrate.

13. The method of claim 11 wherein the substrate comprises a semiconductor die and the contact comprises a bond pad on the die.

14. A method for fabricating a semiconductor component or an interconnect for semiconductor components comprising:

providing a substrate having a contact, a first side and an opposing second side;

forming a mask on the first side having an opening therein;

etching a second opening in the contact using the mask;

directing a laser beam at the second opening and through the substrate without touching the contact to form a via in the substrate;

depositing a conductive member in the via having a first terminal portion proximate to the first side and a second terminal portion proximate to the second side;

stripping the mask;

forming a first non-oxidizing layer on the first terminal portion; and forming a second non-oxidizing layer on the second terminal portion.

15. The method of claim 14 wherein the contact comprises a metal.

16. The method of claim 14 further comprising forming a first insulating layer on the first side prior to forming the mask and forming the mask on the first insulating layer.

17. The method of claim 14 further comprising forming a second insulating layer on the second side and forming the second external contact on the second insulating layer.

18. The method of claim 14 wherein the substrate comprises a semiconductor material and further comprising electrically insulating the via prior to depositing the conductive member.

19. A method for fabricating a semiconductor component or an interconnect for semiconductor components comprising:

providing a substrate having a first side, an opposing second side and a contact on the first side;

forming a first electrically insulating layer on the first side and a second electrically insulating layer on the second side;

forming an opening in the contact;

directing a laser beam at the opening and through the substrate to form a via aligned with the contact;

forming a conductive member in the via and in the opening having a first terminal portion proximate to the first side, and a second terminal portion proximate to the second side;

forming a first non-oxidizing layer on the first terminal portion and on the first electrically insulating layer; and forming a second non-oxidizing layer on the second terminal portion and on the second electrically insulating layer.

20. The method of claim 19 wherein during the directing step the laser beam does not touch the contact.

21. The method of claim 19 wherein forming the conductive member comprises electroless deposition and the first terminal portion and the second terminal portion comprise concave segments.

22. The method of claim 19 wherein the substrate comprises a semiconductor die and the contact comprises a bond pad.

23. The method of claim 19 further comprising forming a mask on the substrate, forming the opening using the mask, and stripping the mask following the directing step.

24. The method of claim 19 wherein the substrate comprises a ceramic or a plastic material.

25. The method of claim 19 wherein the substrate comprises a semiconductor material and further comprising electrically insulating the via prior to forming the conductive member.

26. A method for fabricating a semiconductor component comprising:
- providing a substrate comprising a first side, an opposing second side, and a contact on the first side having an opening therein;
- directing a laser beam through the opening at the first side without touching the contact to form a counter bored via in the substrate;
- forming a conductive member in the via;
- thinning the substrate from the second side to expose the conductive member;
- forming a first external contact on the first side in electrical communication with the conductive member; and
- forming a second external contact on the second side in electrical communication with the conductive member.

27. The method of claim 26 wherein the thinning step is performed using chemical mechanical planarization.

28. The method of claim 26 wherein the substrate comprises a semiconductor die having a plurality of integrated circuits and the contact is in electrical communication with the integrated circuits.

29. The method of claim 26 wherein the substrate comprises a semiconductor wafer.

30. The method of claim 26 wherein the substrate comprises a semiconductor, a ceramic or a plastic.

31. The method of claim 26 further comprising forming a first non-oxidizing metal layer on the first external contact and forming a second non-oxidizing metal layer on the second external contact.

* * * * *